United States Patent
Schäffler

(10) Patent No.: US 6,888,788 B1
(45) Date of Patent: May 3, 2005

(54) METHOD AND ARRANGEMENT FOR DETERMINING AT LEAST ONE DIGITAL SIGNAL FROM AN ELECTRICAL SIGNAL

(75) Inventor: Stefan Schäffler, Augsburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/423,066

(22) PCT Filed: Mar. 23, 1998

(86) PCT No.: PCT/DE98/00850

§ 371 (c)(1),
(2), (4) Date: Nov. 1, 1999

(87) PCT Pub. No.: WO98/49778

PCT Pub. Date: Nov. 5, 1998

(30) Foreign Application Priority Data

Apr. 30, 1997 (DE) .......................... 197 18 424

(51) Int. Cl.[7] .............................................. H04J 11/00
(52) U.S. Cl. ........................ 370/203; 370/206; 370/465; 375/261
(58) Field of Search ................................. 370/203, 206, 370/465, 204, 207, 292, 294, 321, 326, 345, 347; 375/261–265, 240.24, 340, 341, 342; 714/746, 786, 794–795, 1, 752, 755

(56) References Cited

U.S. PATENT DOCUMENTS 5,442,627 A * 8/1995 Viterbi et al. ............... 370/342
5,563,897 A * 10/1996 Pyndiah et al. .............. 714/755
5,721,745 A * 2/1998 Hladik et al. ................ 714/755
5,867,538 A * 2/1999 Liu ............................. 375/341
5,933,462 A * 8/1999 Viterbi et al. ................ 375/341

OTHER PUBLICATIONS

Barbulescu, Iterative Decoding of Turbo Codes And Other Concatenated Codes, A Dissertation, University of South Austrialia, pp. 1–145, Feb. 1996.*

Reed et al, Turbo–Code Termination Schemes and a Novel Alternative for Short Frames, PIMRC'96, pp. 1–14, Jul. 12, 1996.*

Bennedetto et al, A Soft–Input Soft–Output Maximum A Posteriori (MAP) Module to Decode Parallel and Serial Concatenated Codes, TDA Progress Report 42–127, pp. 1–20, Nov. 15, 1996.*

(Continued)

Primary Examiner—Frank Duong
(74) Attorney, Agent, or Firm—Morrison & Foerster LLP

(57) ABSTRACT

The electrical signal contains signal information and redundancy information for the signal information determined from the signal information. A dependability degree is approximated from the electrical signal for forming at least one signal value, and the signal value is determined dependent on the dependency degree. This ensues in that a target function that contains a model of a transmission channel is optimized, and the optimization ensues upon employment of the target function.

16 Claims, 2 Drawing Sheets

OTHER PUBLICATIONS

P. Chevillat, et al., "Decoding of Trellis–Encoded Signals in the Presence of Intersymbol Interference and Noise", IEEE Trans. on Communications, vol. 37, No. 7, Jul. 1989, pp. 669–676.

Y. You, et al., "Blind Equalization by Alternating Minimization for Applications to Mobile Communications", Globecom '95, Proc. of the Global Telecommunications Conference, Singapore, Nov. 14–16, 1995, IEEE, pp. 88–92.

R. Pyndiah, et al., "Near Optimum Decoding of Product Codes", Globecom '94, Proc. of the Global Telecommunications Conference, San Francisco, Nov. 28,–Dec. 2, 1994, IEEE, pp. 339–343.

E. Offer, "Soft–in/Soft–Out Decoders for Linear Stock Codes", Codierung for Quelle, Kanal und Ubertragung, Vortrage der ITG–Fachtagnung, Munich, Germany, Oct. 26–28, 1994, No. 130, Jan. 1, 1994, ITG, pp. 31–40.

B. Friedrichs, "Kanalcodierung, Grundlagen und Anwendungen in modernen Kommunikationssystemen", Springer–Verlag, 1996, pp. 1–30, 69–125, 193–242.

J. Hagenauer, et al., "Interative Decoding of Binary Block and Convolutional Codes", IEEE Trans. On Information Theory, vol. 42, No. 2, 1996, pp. 429–445.

S. Schaeffler, Unconstrained Global Optimization Using Stochastic Integral Equations, Optimization, vol. 35, 1995, pp. 43–60.

* cited by examiner

METHOD AND ARRANGEMENT FOR DETERMINING AT LEAST ONE DIGITAL SIGNAL FROM AN ELECTRICAL SIGNAL

BACKGROUND OF THE INVENTION

The present invention relates to a method and an arrangement for determining at least one digital signal from an electrical signal.

The goal of the information theory established by Claude Shannon in 1948 is to develop efficient codes for encoding transmission and decoding of digital data and to optimally utilize the available information of the encoded data in the decoding insofar as possible.

Yu-Li You et al., "Blind Equalization by Alternating Minimization for Applications to Mobilecommunications", Globecom 95, IEEE Global Telecommunications Conference, Singapore, Nov. 14–16, 1995, Vol. 1, pp. 88–92, discloses an identification of a transmission channel for the transmission of digital data.

Two types of decoding are distinguished in the decoding of digital data:

in what is referred to as hard decision decoding, a received signal infested with noise by the transmission over a channel is decoded into a sequence of digital data, whereby only the digital value of the respectively received signal is classified; and in what is referred to as soft decision decoding, an a posteriori probability for the value to be classified is additionally determined for each information character to be decoded. Such a posteriori probabilities are also referred to as soft outputs and form a criterion for the dependability of the decoding.

Soft decision decoding shall be considered below.

Fundamentals of what are referred to as block codes are known from B. Friedrichs. "Kanalcodierung Grundlagen und Anwendungen in modernen Kommunikationssystemen", Springer-Verlag, 1996, pp. 69–125, 193–242.

It is known from J. Hagenauer et al., "Iterative Decoding of Binary Block and Convolutional Codes", IEEE Trans. on Information Theory, Vol. 42, 1996, to implement a soft decision decoding for a binary, linear block code.

The method from J. Hagenauer et al., "Iterative Decoding of Binary Block and Convolutional Codes" for exact calculation of digital signal values from an electrical signal shall be explained below upon employment of what is referred to as log-likelihood algebra.

It is assumed below that the output of a source encoder of a first arrangement is composed of a sequence of digital, preferably binary signal words that are referred to below as code words. The finite number of stochastically independent random variables $$U_i: \Omega \to [\pm 1], i=1, \ldots, m, m \in N \quad (1)$$

is considered, these being defined on a likelihood space ($\Omega$, S, P). S references a $\sigma$-algebra, i.e. the set of events for which a likelihood is defined. P references a likelihood criterion (P:S$\to$[0, 1]). Under the assumption that the inequalities $$0 < P(\{\omega \in \Omega; U_i(\omega) = 01\}) < 1, i=1, \ldots, m \quad (2)$$

are met, what are referred to L-values of the random variables $U_i$ are defined by $$L(U_i) := \ln\left(\frac{P(\{\omega \in \Omega; U_i(\omega) = +1\})}{P(\{\omega \in \Omega; U_i(\omega) = -1\})}\right), i=1, \ldots, m. \quad (3)$$

Code words u have the following structure:

$$u \in \{\pm 1\}^k.$$

It is thereby assumed for each code word u that each digital value $u_i$, i=1 . . . k of the code word u assumes a first value (logical "0" or logical "+1") or a second value (logical "1" or logical "−1") with the same likelihood. Since one must count on disturbances in the transmission of messages that can falsify the messages, a further encoding step, channel encoding, is implemented.

As described in B. Friedrichs, "Kanalcodierung Grundlagen und Anwendungen in modernen Kommunikationssystemen", Springer-Verlag, 1996, pp. 1–30, redundancy is intentionally added to the incoming code words u in the channel encoding in order to be able to correct possible transmission errors and, thus, assure a high transmission dependability. It is assumed below that a channel code word $c \in \{\pm 1\}^n$, n>k, n$\in$N, is allocated to each code word $u \in \{\pm 1\}^k$. The output of the means for channel encoding is thus composed of code words having the form $c \in \{\pm 1\}^n$.

The channel code words are transmitted from a transmission means to a reception means via a physical channel, for example a subscriber line, coaxial cable, mobile radio telephone, directional radio, etc.

Since the physical channel can often not transmit discrete symbols but only time-continuous signals (i.e., specific functions s: $\Re \to \Re$), a modulator is often provided with which a function which is suitable for the transmission via the physical channel, is allocated to the channel code word c. An important characteristic quantity of the transmitted electrical signal is the average energy Eb that is employed for the transmission of an information bit of the channel code word c.

Since a disturbance can occur in the transmission of an electrical signal via a physical channel, an electrical signal $\tilde{s}$: $\Re \to \Re$ that is modified compared to the transmitted electrical signal is received.

The disturbance is described with methods of stochastic signal theory. A characteristic quantity of the disturbance is the known single-side noise power density No that is determined by the channel. After a potential demodulation of the received electrical signal $\tilde{s}$, a vector y $\in \Re$ is present instead of the code word c. The absolute amount of each component of the vector y is thereby interpreted as dependability information for the corresponding operational sign of the component in the framework of the soft decision decoding.

The channel decoding then has the job—upon employment of the received, potentially demodulated electrical signal $\tilde{s}$ that is ultimately available as vector y—of reconstructing the code word u that was originally present.

It is standard to model the physical channel and the noise properties thereof. A model frequently employed for this purpose is what is referred to as the invariant AWGN channel (additive Gaussian white noise). When a modulator and a demodulator are present the totality of modulator, physical channel and demodulator is referred to below as the channel in this model. Given the AWGN channel, it is assumed that the output of the channel encoder, i.e. the channel code word c is additively superimposed by an $$N\left(\varrho \frac{N_0 n}{2E_b k}, L_n\right)$$

—normally distributed random variable, whereby $l_n$ references the n-dimensional unit matrix. The quotient $$\frac{N_0}{E_b}$$

is known and is also referred to as signal-to-noise ratio.

By complete induction for m, it can be shown on the basis of the stochastic independence of the random variables $U_1, \ldots, U_m$ that the following is valid for the L-value of the chained random variables $U_1 \oplus \ldots \oplus U_m$ ($\oplus$ references an exclusive-OR operation):

$$U_1 \oplus U_2 \oplus \ldots U_m: \Omega \to \{\pm 1\}, \omega \to U_1(\omega) \oplus U_2(\omega) \oplus \ldots U_m(\omega) \quad (4)$$

and $$L(U_1 \oplus U_2 \oplus \ldots U_m) = \ln\left(\frac{1 + \prod_{i=1}^{m} \frac{\exp(L(U_i)) - 1}{\exp(L(U_i)) + 1}}{1 - \prod_{i=1}^{m} \frac{\exp(L(U_i)) - 1}{\exp(L(U_i)) + 1}}\right). \quad (5)$$

The following initial situation derives for the method known from J. Hagenauer et al., "Iterative Decoding of Binary Block and Convolutional Codes natural number k, n and sets $J_{k+1}, \ldots, J_n \subseteq \{1, \ldots, k\}$, that describe the properties of the channel encoder are established, as is the non-negative, real number $$\frac{N_0}{E_b}.$$

The number of digital values of the channel code word u is referenced k. The number of digital values of the channel code word $c \in \{\pm 1\}^n$, is referenced n, with n>k. The n-k digital values that are attached to the code words u in the formation of the channel code word c, which are also referred to as check bits, are characterized by $J_{k+1}, \ldots, J_n \subseteq \{1, \ldots, k\}$.

Further, a likelihood space ($\Omega$, S, P) and a small-dimensional random variable C $$C\Omega \to \{\pm 1\}^n \quad (6)$$

having the following properties is established:

components $$C_1, \ldots, C_k : \Omega \to \{\pm 1\} \quad (7)$$

of the n-dimensional random variable $\underline{C}$ are stochastically independent and $$P(\omega \in \Omega; C_i(\omega) = -1) = P(\omega \in \Omega; C_i(\omega) = +1) = \tfrac{1}{2} \quad (8)$$

applies to all $i = 1, \ldots, k$.

the following applies to each $i \in \{k+1, \ldots, n\}$ and to all $\omega \in \Omega$:

$$C_i(\omega) = \bigoplus_{j \in J_i} C_j(\omega). \quad (9)$$

The digital values that are formed by the channel encoding, i.e. the channel code words $\underline{c}$, are interpreted as realization of the random variables $\underline{C}$.

The output $\bar{u}$ of the channel decoder to be reconstructed, which is referred to below as a set of digital signal values, are the corresponding realization of the random variables $$U: \Omega \to \{\pm 1\}^k, \omega \to (C_1(\omega), \ldots, C_k(\omega))^T \quad (10).$$

The output $$\underline{y} \in \Re^n \quad (11)$$

of the unit for demodulation or, the vector that describes the electrical signal and for which the decoding ensues is interpreted as realization of the random variables $$\underline{Y}: \to \Re^n, \omega \to \underline{C}(\omega) + Z(\omega) \quad (12)$$

whereby $Z: \Omega \to \Re^n$ is $$N\left(\varrho \frac{N_0 n}{2E_b k}, L_n\right)$$

—normally distributed random variable that is stochastically independent of the n-dimensional random variable $\underline{C}$. The code word $\bar{u}$ is reconstructed based on the vector $\underline{y}$ describing the received electrical signal.

In order to reconstruct the individual digital signal values, the distribution of the random variables C is investigated under the condition that the vector $\underline{y}$ describing the electrical signal was received.

The likelihoods induced by this distribution are referred to as a posteriori likelihoods.

The following quantities are considered for each $\epsilon > 0$:

$$L_\epsilon(U_i | \underline{y}) := \ln\left(\frac{P(\{\omega \in \Omega; U_i(\omega) = +1\} | \{\omega \in \Omega; \underline{Y}(\omega) \in M_{\underline{y},\epsilon}\})}{P(\{\omega \in \Omega; U_i(\omega) = +1\} | \{\omega \in \Omega; \underline{Y}(\omega) \in M_{\underline{y},\epsilon}\})}\right) = \quad (13)$$

$$= \ln\left(\frac{\sum_{\substack{\underline{v} \in C \\ v_i = +1}} P(\{\omega \in \Omega; \underline{C}(\omega) = \underline{v}\} | \{\omega \in \Omega; \underline{Y}(\omega) \in M_{\underline{y},\epsilon}\})}{\sum_{\substack{\underline{v} \in C \\ v_i = -1}} P(\{\omega \in \Omega; \underline{C}(\omega) = \underline{v}\} | \{\omega \in \Omega; \underline{Y}(\omega) \in M_{\underline{y},\epsilon}\})}\right).$$

for $i = 1, \ldots, k$, whereby $$M_{\underline{y},\epsilon} := [y_1, y_1 + \epsilon] \times \ldots \times [y_n, y_n + \epsilon] \quad (14)$$

and C references the set of all channel code words c.

The following derives by employing theorem of Bayes:

$$L_\epsilon(U_i | \underline{y}) := \ln\left(\frac{\sum_{\substack{\underline{v} \in C \\ v_i = +1}} P(\{\omega \in \Omega; \underline{Y}(\omega) \in M_{\underline{y},\epsilon}\} | \{\omega \in \Omega; \underline{C}(\omega) = \underline{v}\})}{\sum_{\substack{\underline{v} \in C \\ v_i = -1}} P(\{\omega \in \Omega; \underline{Y}(\omega) \in M_{\underline{y},\epsilon}\} | \{\omega \in \Omega; \underline{C}(\omega) = \underline{v}\})}\right) \quad (15)$$

-continued $$= \ln \left( \frac{\sum\limits_{\substack{\underline{v} \in C \\ v_i = +1}} \int_{M_{\underline{y},\varepsilon}} \exp\left(-\frac{(\underline{x}-\underline{v})^T(\underline{x}-\underline{v})}{\frac{N_0 n}{E_b k}}\right) d\underline{x}}{\sum\limits_{\substack{\underline{v} \in C \\ v_i = -1}} \int_{M_{\underline{y},\varepsilon}} \exp\left(-\frac{(\underline{x}-\underline{v})^T(\underline{x}-\underline{v})}{\frac{N_0 n}{E_b k}}\right) d\underline{x}} \right).$$

When the boundary transition of (14) for $\varepsilon \to 0$ is considered by multiple employment of the rule of De L'Hospital, then the soft outputs $L(U_i|\underline{y})$ are obtained for each character according to the following rule:

$$L(U_i | \underline{y}) = \ln \left( \frac{\sum\limits_{\substack{\underline{v} \in C \\ v_i = +1}} \exp\left(-\frac{(\underline{y}-\underline{v})^T(\underline{y}-\underline{v})}{\frac{N_0 n}{E_b k}}\right)}{\sum\limits_{\substack{\underline{v} \in C \\ v_i = -1}} \exp\left(-\frac{(\underline{y}-\underline{v})^T(\underline{y}-\underline{v})}{\frac{N_0 n}{E_b k}}\right)} \right). \quad (16)$$

The soft outputs that, on the one hand, usually contain an operational sign information and a dependability information (absolute amount of the soft output), are referred to below as a dependability degree.

In a completely analogous way, the following is obtained for $i = k+1, \ldots, n$:

$$L\left(\bigoplus_{j \in J_i} U_j \,\bigg|\, \underline{y}\right) = \ln \left( \frac{\sum\limits_{\substack{\underline{v} \in C \\ v_i = +1}} \exp\left(-\frac{(\underline{y}-\underline{v})^T(\underline{y}-\underline{v})}{\frac{N_0 n}{E_b k}}\right)}{\sum\limits_{\substack{\underline{v} \in C \\ v_i = -1}} \exp\left(-\frac{(\underline{y}-\underline{v})^T(\underline{y}-\underline{v})}{\frac{N_0 n}{E_b k}}\right)} \right). \quad (17)$$

The decoding in the known method ensues such that, when the dependability degree exhibits a value greater than 0, the $i^{th}$ component $u_i$ of the code word $\hat{u}$ to be reconstructed is reconstructed with the second value (logical "1" or logical "−1"). For a value of the dependability degree less than 0, the first value (logical "0" or logical "+1") is allocated to the digital signal value. One can arbitrarily decide in favor of the first or the second value for a value of the dependability degree equal to 0. The absolute amount of the dependability degree is a criterion for the dependability of the above decision rules. The reconstruction is all the more dependable the higher the absolute amount.

What is disadvantageous about this known method is the outlay for computer-assisted determination of the dependability degree. The determination of the dependability degree generally requires an outlay for additions that is proportional to min $(2^k, 2^{n-k})$. The direct calculation of the dependability degrees and the determination of the digital values dependent on the dependability degrees is thus often not numerically realizable. Approximately $10^{20}$ additions would be required for what is referred to as the BCH (255, 191)—Code (see B. Friedrichs, Kanalcodierung Grundlagen und Anwendungen in modernen Kommunikationssystemen", Springer-Verlag, 1996, pp. 69–125, 193–242, for the calculation of the 191 dependability degrees and digital signal values.

SUMMARY OF THE INVENTION

It is an object of the present invention to provide a method and an arrangement for determining at least one digital signal value from an electrical signal that contains signal information and redundancy information for the signal information determined from the signal information, whereby a simplified determination compared to the known method is possible.

This object is achieved in accordance with the invention in a method for determining at least one digital signal value from an electrical signal transmitted via a transmission channel, said electrical signal having signal information and redundancy information for said signal information determined from said signal information. A target function, which has a model of a transmission channel via which the electrical signal was transmitted, is optimized. A dependability degree is approximated. The dependability degree is for forming a digital signal value from the electrical signal based on the optimized target function. A digital signal value dependent on said dependability degree is determined.

A dependability degree for forming the signal value is approximated from the electrical signal and the signal value is determined dependent on the dependability degree.

The object of the invention is also achieved in accordance with the invention in an arrangement having a computer unit that is configured such that a dependability degree for forming the signal value is approximated from the electrical signal and such that the signal value is determined dependent on the dependability degree.

In an arrangement for determining at least one digital signal value from an electrical signal transmitted via a transmission channel, the electrical signal having signal information and redundancy information for the signal information determined from the signal information, the arrangement comprises a computer unit having a processor and a memory including a program operating according to the above described method. The approximation of the dependability degree ensues such that a target function is optimized, whereby the target function contains a model of a transmission channel over which the electrical signal was transmitted.

Due to the approximation of the dependability degree that had to be exactly determined hitherto and dependent whereon the signal value is determined, a considerable simplification is achieved in the determination of the digital signal value. This leads to a substantially faster implementation of the method by a computer or, to considerable saving of costs for the realization of the arrangement for determining the digital signal value. A numerical solution of the soft decision decoding thus often becomes possible at all for the first time.

The present invention can be clearly seen therein that the dependability degree that was hitherto only exactly calculated, is approximated.

Due to the approximation of the dependability degree by the optimization of the target function, an extremely simple and, thus, quickly implemented possibility is recited that even takes the properties of the transmission channel and, thus, the noise properties of the disturbed signal into consideration.

The minimization of the target function that contains the properties of the channel in the form of the model as approximation criterion leads thereto that the efficiency of the method or, of the arrangement is substantially improved. As a result of this development, a considerable reduction of the signal-to-noise ratio $$\frac{N_0}{E_b}$$

is achieved compared to known methods given the same bit error probability in the determination of the digital signal values. The improvement of the signal-to-noise ratio amounts to up to approximately 3 dB dependent on the channel encoding employed, which would correspond to the maximum improvement that could be theoretically achieved.

A saving of 1 dB, for example, can already lead to a cost saving of approximately 70 million U.S. dollars in the construction of a space probe given radio transmission from space probes. Considerable cost savings are is thus possible for the control center as well when the decoding ensues according to this embodiment or when the arrangement according to the embodiment is configured such that the approximation ensues by optimizing a target function that contains a model of the transmission channel.

In an embodiment both of the method as well as of the arrangement, further, it is advantageous that the target function is formed according to the following rule:

$$f = \sum_{i=1}^{k} \left(\beta_i - \frac{4E_b k}{N_0 n} y_i\right)^2 + \sum_{i=k+1}^{n} \left( \ln\left( \frac{1 + \prod_{j \in J_i} \frac{\exp(\beta_j) - 1}{\exp(\beta_j) + 1}}{1 - \prod_{j \in J_i} \frac{\exp(\beta_j) - 1}{\exp(\beta_j) + 1}} \right) - \frac{4E_b k}{N_0 n} y_i \right)^2.$$

A modified scaling or a slight modification and neglecting of some values in the target function as well as the degree of the counter function (degree of the target function) is thereby not critical and can be arbitrarily varied.

This target function indicates a model for the transmission channel in which the assumed model properties of the transmission channel taken into consideration, this supplying extremely good results in the determination of the signal values after the optimization given optimization of the target function, for example, a minimization of the error function.

It is also advantageous to subject the target function to a global minimization since the information contained in the electrical signal is optimally utilized in the framework of the optimization due to this procedure and, thus, is also optimally utilized in the determination of the signal value.

It is also advantageous that the electrical signal is a radio signal and, thus, the arrangement is a radio transmission system with an inventive arrangement, since the method enables substantial savings specifically in the area of radio transmission, particularly in the transmission of radio signals with a space probe.

The method can also be advantageously utilized in the archiving and reconstruction of archived, stored digital data that is contained in a storage medium (for example, magnetic tape store, hard disc store, etc.), since an improved signal-to-noise ratio is also of considerable significance in this application.

These and other features of the invention(s) will become clearer with reference to the following detailed description of the presently preferred embodiments and accompanied drawings.

DETAILED DESCRIPTION OF THE PRESENTLY PREFERRED EMBODIMENTS

Figure 2:
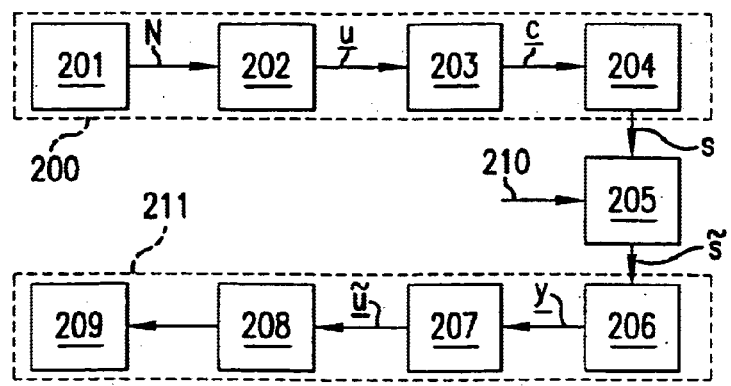
FIG. 2 is a block circuit diagram showing the sending, the transmission and the reception of the electrical signals.

FIG. 2 symbolically shows a message N proceeding from a source 201 to be transmitted to a sync 209.

The message N to be transmitted is supplied to a source coder 202, where it is compressed such that, although no information is lost, redundancy information superfluous for the decoding of the message N is eliminated and, thus, the required transmission capacity is reduced.

The output of the source coder 202 is the code word u $\in \{\pm 1\}^k$ that is composed of a sequence of digital values. It is thereby assumed for each code word u that each value $u_i$, i=1, . . . k of the code words u assumes a first value (logical "0" or logical "+1") or, a second value (logical "1" or logical "−1") with the same probability.

The code word u is supplied to a unit for channel encoding 203 wherein a channel encoding of the code word u ensues. In the channel encoding, redundancy information is intentionally attached to the code word u in order to be able to correct or at least recognize transmission errors that possibly arise during the transmission and, thus, to achieve a high transmission dependability.

It is assumed below that the channel encoding allocates a channel code word $c \in \{\pm 1\}^n$ to each code word $u \in \{\pm 1\}^k$. The output of the unit for channel encoding 203 is thus composed of the channel code word $c \in \{\pm 1\}^n$.

The channel code word $c \in \{\pm 1\}^n$ is supplied to a unit for modulation 204 of the channel code word $\underline{c}$. In the modulation, a function s: $\Re \rightarrow \Re$ suitable for the transmission over a physical channel 205 is allocated to the channel code word $\underline{c}$.

The signal to be transmitted thus contains both signal information, i.e. the channel code word c, as well as redundancy information determined from the signal information, i.e. additionally contains what are referred to as check values. The modulated signal s is transmitted via the physical channel 205 to a receiver unit 211. A disturbance 210 that falsifies the modulated signal s often occurs during the transmission over the physical channel 205. A modified, modulated signal $\tilde{s}$ is thus adjacent at the receiver unit 211, this being supplied to the unit for demodulation 206.

A demodulation of the modified, modulated signal $\tilde{s}$ ensues in the unit for demodulation 206. The output of the demodulation is a vector $\underline{y} \in \Re^n$ referred to below as an electrical signal that describes the digital, demodulated, modified signal $\tilde{s}$.

During the course of further considerations, the model of what is referred to as the AWGN channel is employed for modeling the physical channel 205, as was set forth above. For simplification, both the unit for modulation 204 as well as the unit for demodulation 206 of the transmitter 200 or, respectively, of the receiver 211 is also considered in the model of the transmission channel.

The electrical signal $\underline{y}$ is subjected to a channel decoding in a unit for channel decoding 207. Vector components $y_i$ of the electrical signal $\underline{y}$ contain both an operational sign information as well as an amount information.

The amount information is respectively the absolute value of the vector components $y_i$ that is also referred to as dependability information for the corresponding operational sign of the vector components $y_i$.

The job in the channel decoding is to implement what is referred to as a soft decision decoding. This means that, first, a reconstructed code word $\tilde{u}$ is reconstructed and, further, a dependability information is determined for each component, this describing the decision made for reconstruction of a component $\tilde{u}_i$ of the reconstructed code word $\tilde{u}$. A component $\tilde{u}_i$ of the reconstructed code word $\tilde{u}$ is referred to below as digital signal value.

The reconstructed code word $\tilde{u}$, i.e. at least one digital signal value, is supplied to a unit for source decoding 208 wherein a source decoding ensues. Finally, the decoded signal is supplied to the sync 209.

Figure 1:
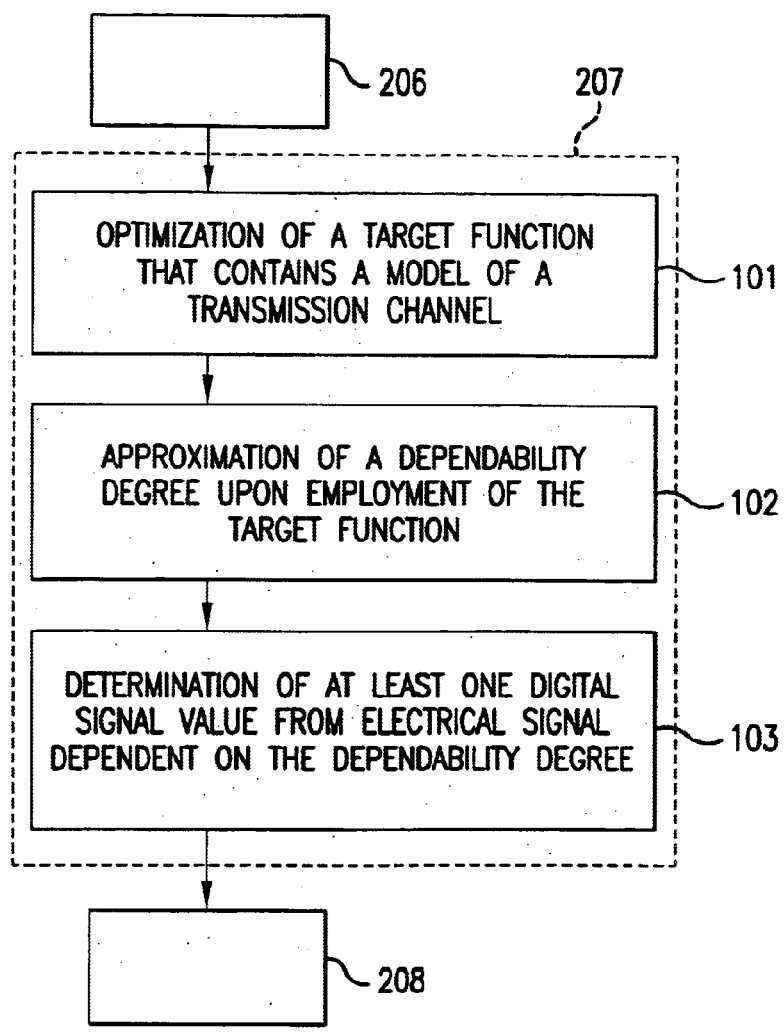
FIG. 1 is a flow chart of a method for determining at least one digital signal value from an electrical signal implemented in a computer unit.

The channel decoding 207 is described in greater detail in FIG. 1 in the form of a flow chart.

In a first Step 101, a target function f, which contains a non-linear regression model of the transmission channel 204, 205, 206, is optimized.

The non-linear regression model is derived below for illustration.

From the following rule (16) for exact determination of the dependability degree, $$L(U_i \mid \underline{y}) = \ln \left( \frac{\sum_{\substack{\underline{v} \in C \\ v_i = +1}} \exp\left(-\frac{(\underline{y} - \underline{v})^T(\underline{y} - \underline{v})}{\frac{N_0 n}{E_b k}}\right)}{\sum_{\substack{\underline{v} \in C \\ v_i = -1}} \exp\left(-\frac{(\underline{y} - \underline{v})^T(\underline{y} - \underline{v})}{\frac{N_0 n}{E_b k}}\right)} \right). \quad (16)$$

wherein $N_o$ indicates a single-sided noise power density, n indicates a number of digital signal values contained in the signal, $E_b$ denotes an average signal energy for one of the k signal values, i.e. of the information bits, k denotes a number of digital signal values contained in the electrical signal, $\underline{y}$ denotes a vector from $\mathfrak{R}^n$ that describes the signal, C denotes the set of all channel code words, $\underline{C}$ denotes an n-dimensional random quantity for describing the signal value, $\underline{v}$ denotes a vector from C, i denotes an index for unambiguous identification of the signal value $v_i$, $U_i$ denotes a random variable of the signal value $v_i$, $L(U_i \mid \underline{y})$ denotes the dependability degree, $J_i$ denotes a set of digital values of the redundancy information, and j denotes a further index, the factor in the numerator, $$\exp\left(-\frac{(y_i - 1)^2}{\frac{N_0 n}{E_b k}}\right) \quad (18)$$

and the factor in the denominator $$\exp\left(-\frac{(y_i + 1)^2}{\frac{N_0 n}{E_b k}}\right) \quad (19)$$

can be bracketed out.

After the bracketing, the following rule derives for all i=1, ..., k with corresponding factors $T_i$ that are now no longer dependent on the components $y_i$ of the electrical signal:

$$L(U_i \mid \underline{y}) = \ln \frac{\exp\left(-\frac{(y_i - 1)^2}{\frac{N_0 n}{E_b k}}\right)}{\exp\left(-\frac{(y_i + 1)^2}{\frac{N_0 n}{E_b k}}\right)} + \tau_i = \frac{4 E_b k}{N_0 n} y_i + \tau_i. \quad (20)$$

The following is valid for i=k+1, ..., n:

$$L\left(\bigoplus_{j \in J_i} U_j \,\bigg|\, \underline{y}\right) = \frac{4 E_b k}{N_0 n} y_i + \tau_i. \quad (21)$$

If the physical channel 205 were not disturbed, then the observation of the respective components $y_i$ of the electrical signal would suffice for i=1, ..., k in order to determine the distribution of $U_i$ under the condition that the random variable $\underline{Y}$ assumes the value $\underline{y}$. All factors $T_i = 0$ would thus be the case. The situation is analogous for i=k+1, ..., n with the distribution $$\bigoplus_{j \in J_i} U_j$$

under the condition that the random variable $\underline{Y}$ assumes the value $\underline{y}$. In this case, too, all factors $t_i = 0$ would apply. The absolute values of the factors $T_1, \ldots T_n$ are thus a measure for the channel disturbance.

Under the condition that the signal $\underline{y}$ was received, the stochastic independence of the variables $U_1, \ldots, U_k$ is lost.

Therefore valid for i=k+1, ..., n with corresponding error factor $\rho_i$:

$$L\left(\bigoplus_{j \in J_i} U_j \,\bigg|\, \underline{y}\right) = \ln \left( \frac{1 + \prod_{j \in J_i} \frac{\exp(L(U_j \mid \underline{y})) - 1}{\exp(L(U_j \mid \underline{y})) + 1}}{1 - \prod_{j \in J_i} \frac{\exp(L(U_j \mid \underline{y})) - 1}{\exp(L(U_j \mid \underline{y})) + 1}} \right) + \rho_i. \quad (22)$$

It is also obvious for the error factors $\rho_{k+1}, \ldots, \rho_n$ that all $\rho_{k+1}, \ldots, \rho_n$ can be set equal to 0 when the physical channel is not disturbed.

The following rule derives overall:

$$\frac{4E_b k}{N_0 n}\underline{y} = \begin{pmatrix} L(U_1|\underline{y}) \\ \vdots \\ L(U_k|\underline{y}) \\ \ln\left(\frac{1+\prod_{j\in J_{k+1}}\frac{\exp(L(U_j|\underline{y}))-1}{\exp(L(U_j|\underline{y}))+1}}{1-\prod_{j\in J_{k+1}}\frac{\exp(L(U_j|\underline{y}))-1}{\exp(L(U_j|\underline{y}))+1}}\right) \\ \vdots \\ \ln\left(\frac{1+\prod_{j\in J_n}\frac{\exp(L(U_j|\underline{y}))-1}{\exp(L(U_j|\underline{y}))+1}}{1-\prod_{j\in J_n}\frac{\exp(L(U_j|\underline{y}))-1}{\exp(L(U_j|\underline{y}))+1}}\right) \end{pmatrix} - \begin{pmatrix} \tau_1 \\ \vdots \\ \tau_k \\ \tau_{k+1}-\rho_{k+1} \\ \vdots \\ \tau_n-\rho_n \end{pmatrix}. \quad (23)$$

When the values for $i=1, \ldots, k$ $L(U_i|\underline{y})=\beta_i$; $-\tau_i=e_i$ for $i=k+1, \ldots, n$ $\rho_i-\tau_i=e_i$ (24), are replaced, then the following non-linear regression problem derives therefrom:

$$\frac{4E_b k}{N_0 n}\underline{y} = \begin{pmatrix} \beta_1 \\ \vdots \\ \beta_k \\ \ln\left(\frac{1+\prod_{j\in J_{k+1}}\frac{\exp(\beta_j)-1}{\exp(\beta_j)+1}}{1-\prod_{j\in J_{k+1}}\frac{\exp(\beta_j)-1}{\exp(\beta_j)+1}}\right) \\ \vdots \\ \ln\left(\frac{1+\prod_{j\in J_n}\frac{\exp(\beta_j)-1}{\exp(\beta_j)+1}}{1-\prod_{j\in J_n}\frac{\exp(\beta_j)-1}{\exp(\beta_j)+1}}\right) \end{pmatrix} + \underline{e}. \quad (25)$$

Since an error vector $\underline{e}$ is equal to the 0 vector when no disturbance of the physical channel is established and due to the stochastic model of the channel disturbance, it is assumed that the error vector $\underline{e}$ is a realization of a random variable E: $\Omega \to \mathfrak{R}^n$ with anticipation value $E(E=0)$. The dependability degrees are thus approximated by minimization of the influence of the channel disturbance.

Respectively one dependability measure serves for the reconstruction of a respective digital signal value.

The non-linear regression problem is formulated and solved by a target function f when the target f is optimized, minimized in this case.

The target function f is formed according to the following rule:

$$\min\{\underline{e}(\beta)^T \underline{e}(\beta)\} = \min\{f\}$$

with $$f = \quad (26)$$

$$\sum_{i=1}^{k}\left(\beta_i - \frac{4E_b k}{N_0 n}y_i\right)^2 + \sum_{i=k+1}^{n}\left(\ln\left(\frac{1+\prod_{j\in J_i}\frac{\exp(\beta_j)-1}{\exp(\beta_j)+1}}{1-\prod_{j\in J_i}\frac{\exp(\beta_j)-1}{\exp(\beta_j)+1}}\right) - \frac{4E_b k}{N_0 n}y_i\right)^2.$$

The solution of the non-linear regression problem ensues by minimization of the target function f.

A method for global minimization that is known from S. Schaeffler, "Unconstrained Global Optimization Using Stochastic Integral Equations", Optimization. Vol. 35, 1995, pp. 43–60, is employed for the minimization of the target function f.

The target function f is generally not convex and it is therefore advantageous to utilize an algorithm for global minimization for the minimization of the target function, because it is possible in this way to optimally utilize the given information in the sense of information theory.

A respective dependability degree is approximated (Step 102) for the components $y_i$ of the electrical signal $\underline{y}$ upon employment of a neural network whose structure is derived on the basis of the determined parameters of the optimized target function f.

In a last step 103, the digital signal value or, the digital signal value $\tilde{u}_i$ is determined from the electrical signal $\underline{y}$ dependent on the dependability degree. The operational sign information of the respective dependability degree is thereby employed as a criterion for the allocation of the first or, of the second value the digital signal value $\tilde{u}_i$.

When the dependability degree comprises a value greater than 0, then the second value (logical "1" or logical "−1") is allocated to the digital signal value $\tilde{u}_i$ and, when the dependability degree exhibits a value smaller then 0, then the first value (logical "0" or, logical "+1") is allocated to the digital signal value $\tilde{u}_i$.

This is implemented for all digital signal values $\tilde{u}_i$ to be reconstructed whose reconstruction is desired.

The arrangement for channel decoding 207 is configured such that the above-described method is implemented. This can ensue by programming a computer unit or can also ensue with an electrical circuit adapted to the method.

A few alternatives and generalizations of the above-described method or, of the arrangement are disclosed below:

It is not necessary to implement a global minimization of the target function. The minimization can likewise ensue with a method for local minimization, for example with what is referred to as the BFGS method (Broyden, Fletcher, Goldfarb, Shanno method). Further, the minimization of the target function is not limited to the method described in S. Schaeffler, "Unconstrained Global Optimization Using Stochastic Integral Equations", Optimization, Vol. 35, 1995, pp. 43–60, therefor; Further methods for minimization can likewise be utilized.

It is also not necessary that a quadratic norm is minimized as target function; any arbitrary norm of the vector e ($\beta$) can generally be utilized.

Figure 3:
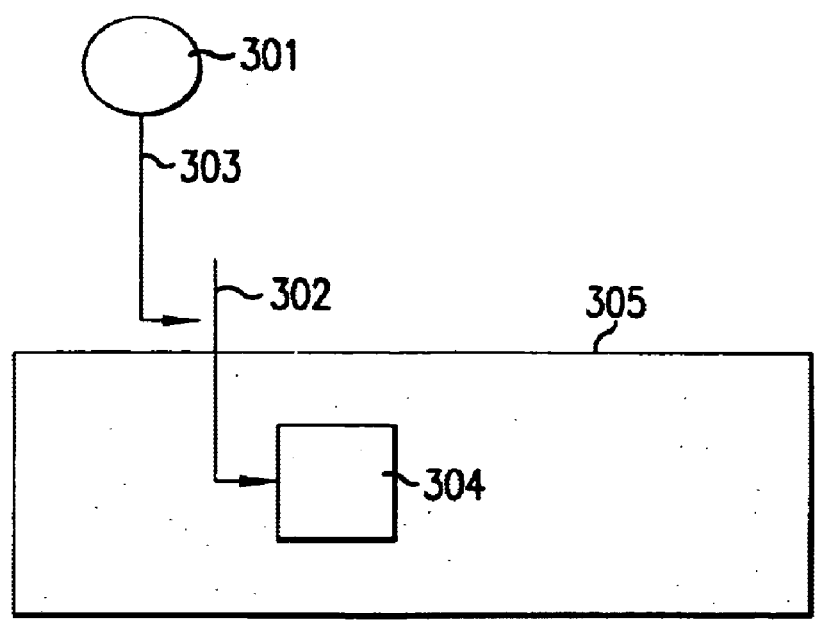
FIG. 3 is a block diagram of a radio transmission system.

FIG. 3 shows a radio transmission system that contains an arrangement having the above-described features. A transmission means 301, preferably a space probe, transmits a radio signal 303 via a physical channel 205, in this case through the air. The radio signal 303 is received via an antenna 302 of the receiver arrangement 305 and is supplied as an electrical signal to the arrangement 304 that contains the means for demodulation 206, the means for channel decoding 207 as well as the means for source decoding 208.

Figure 4:
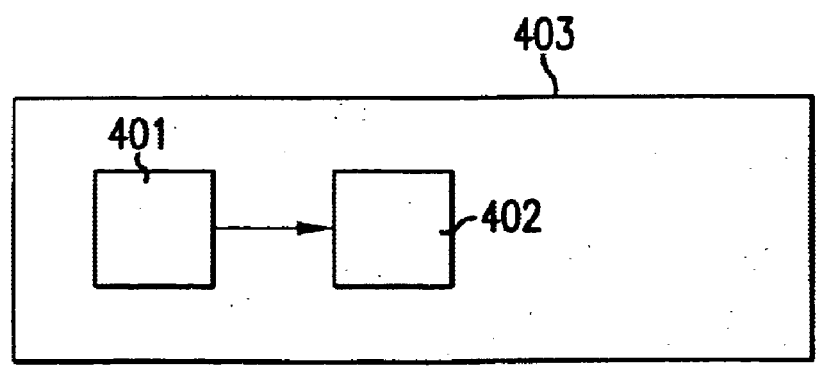
FIG. 4 is a block diagram of an archiving system for archiving digital data.

FIG. 4 shows a system 403 for the reconstruction of archived digital data. Digital data is archived in memory 401, for example, a magnetic store (magnetic band store, hard disk store, etc.). In the reconstruction, the above-described method for reconstruction of the at least one digital signal value $\tilde{u}_i$ from the electrical signal which, in this case, describes digital signals read out from the memory 401 can be implemented upon employment of an arrangement 402 having the means for channel decoding 207.

It is clear that the invention can be seen therein that the dependability degree that was hitherto only exactly calculated is approximated.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A method for determining at least one digital signal value from an electrical signal transmitted via a transmission channel, said electrical signal having signal information and redundancy information for said signal information determined from said signal information, the method comprising:

optimizing a target function having a model of a transmission channel via which said electrical signal was transmitted;

approximating a dependability degree for forming a digital signal value from said electrical signal based on said optimized target function; and determining said digital signal value dependent on said dependability degree, wherein the model is a non-linear regression model of said transmission channel and the electrical signal is a systematic block code.

2. The method according to claim 1, wherein said step of determining said digital signal value further comprises determining a number of digital signal values from said electrical signal.

3. The method according to claim 1 wherein said target function is formed according to a rule:

$$f = \sum_{i=1}^{k} \left(\beta_i - \frac{4E_bk}{N_0n}y_i\right)^2 + \sum_{i=k+1}^{n} \left(\ln\left(\frac{1 + \prod_{j \in J_i}\frac{\exp(\beta_j)-1}{\exp(\beta_j)+1}}{1 - \prod_{j \in J_i}\frac{\exp(\beta_j)-1}{\exp(\beta_j)+1}}\right) - \frac{4E_bk}{N_0n}y_i\right)^2.$$

with $\beta_i = L(U_i|\underline{y}_i)$, and with $$L(U_i|\underline{y}) = \ln\left(\frac{\sum_{\substack{\underline{v} \in C \\ v_i = +1}} \exp\left(-\frac{(\underline{y}-\underline{v})^T(\underline{y}-\underline{v})}{\frac{N_0n}{E_bk}}\right)}{\sum_{\substack{\underline{v} \in C \\ v_i = +1}} \exp\left(-\frac{(\underline{y}-\underline{v})^T(\underline{y}-\underline{v})}{\frac{N_0n}{E_bk}}\right)}\right)$$

, and wherein $N_o$ indicates a single-sided noise power density of said transmission channel, n indicates a number of digital signal values contained in said transmission channel, $E_b$ denotes an average signal energy for one of k digital signal values, k denotes a number of digital signal values contained in said electrical signal, $\underline{y}$ denotes a vector from $\Re^n$ that describes said electrical signal, C denotes a set of all transmission channel code words, $\underline{C}$ denotes an n-dimensional random quantity for describing said digital signal value, $\underline{v}$ denotes a vector from C, i denotes an index for unambiguous identification of said digital signal value $v_i$, $U_i$ denotes a random variable of said digital signal value $v_i$, $L(U_i|y)$ denotes said dependability degree, $J_i$ denotes a set of digital values of said redundancy information, and j denotes a further index.

4. The method according to claim 1, further comprising the step of: subjecting said target function to a global minimization.

5. The method according to claim 1, wherein said dependability degree comprises an operational sign information and an amount information; and whereby said signal value is determined only dependent on said operational sign information.

6. The method according to claim 1, wherein said electrical signal is a radio signal.

7. The method according to claim 1, wherein said electrical signal is a restored signal of archived digital data.

8. An arrangement for determining at least one digital signal value from an electrical signal transmitted via a transmission channel, said electrical signal having signal information and redundancy information for said signal information, said arrangement comprising:

a computer unit having a processor and a memory including a program comprising optimizing a target function having a model of a transmission channel via which said electrical signal was transmitted;

approximating a dependability degree for forming a digital signal value from said electrical signal based on said optimized target function; and determining said digital signal value dependent on said dependability degree, wherein the computer unit program is a non-linear regression model of said transmission channel, and the electrical signal is a systematic block code.

9. The arrangement according to claim 8, further comprising a receiver unit for receiving said electrical signal and for supplying said electrical signal to said computer unit.

10. The arrangement according to claim 9, further comprising a demodulator unit for demodulation of said electrical signal, said demodulator having an input connected to said receiver unit and an output connected to said computer unit.

11. The arrangement according to claim 9, wherein said receiver unit is an antenna.

12. The arrangement according to claim 8, wherein said computer unit is programmed to determine a number of digital signal values from said electrical signal.

13. The arrangement according to claim 8, wherein said target function in said computer unit program operates according to a rule:

$$f = \sum_{i=1}^{k}\left(\beta_i - \frac{4E_b k}{N_0 n} y_i\right)^2 + \sum_{i=k+1}^{n}\left(\ln\left(\frac{1+\prod_{j\in J_i}\frac{\exp(\beta_j)-1}{\exp(\beta_j)+1}}{1-\prod_{j\in J_i}\frac{\exp(\beta_j)-1}{\exp(\beta_j)+1}}\right) - \frac{4E_b k}{N_0 n} y_i\right)^2$$

with $\beta_i = L(U_i|\underline{y}_i)$, and with $$L(U_i|\underline{y}) = \ln\left(\frac{\sum_{\substack{\underline{v}\in C \\ v_i=+1}}\exp\left(-\frac{(\underline{y}-\underline{v})^T(\underline{y}-\underline{v})}{\frac{N_0 n}{E_b k}}\right)}{\sum_{\substack{\underline{v}\in C \\ v_i=+1}}\exp\left(-\frac{(\underline{y}-\underline{v})^T(\underline{y}-\underline{v})}{\frac{N_0 n}{E_b k}}\right)}\right)$$

, and wherein $N_o$ indicates a single-sided noise power density of said transmission channel, n indicates a number of digital signal values contained in said transmission channel, $E_b$ denotes an average signal energy for one of k digital signal values, k denotes a number of digital signal values contained in said electrical signal, $\underline{y}$ denotes a vector from $\Re^n$ that describes said electrical signal, C denotes a set of all transmission channel code words, $\underline{C}$ denotes an n-dimensional random quantity for describing said digital signal value, $\underline{v}$ denotes a vector from C, i denotes an index for unambiguous identification of said digital signal value $v_i$, $U_i$ denotes a random variable of said digital signal value $v_i$, $L(U_i|\underline{y})$ denotes said dependability degree, $J_i$ denotes a set of digital values of said redundancy information, and j denotes a further index.

14. The arrangement according to claim 8, wherein said program further comprises the step of:

subjecting said target function to a global minimization.

15. The arrangement according to claim 8, wherein said arrangement is allocated to a radio transmission system.

16. The arrangement according to claim 8, wherein said arrangement is allocated to a system for reconstruction of archived digital data.

* * * * *